US 6,573,167 B2

(12) United States Patent
Xing et al.

(10) Patent No.: US 6,573,167 B2
(45) Date of Patent: Jun. 3, 2003

(54) USING A CARBON FILM AS AN ETCH HARDMASK FOR HARD-TO-ETCH MATERIALS

(75) Inventors: Guoqiang Xing, Plano, TX (US); Wei-Yung Hsu, Dallas, TX (US); Changming Jin, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/921,119

(22) Filed: Aug. 2, 2001

(65) Prior Publication Data

US 2002/0037637 A1 Mar. 28, 2002

Related U.S. Application Data

(60) Provisional application No. 60/224,155, filed on Aug. 10, 2000.

(51) Int. Cl.[7] .............................. H01L 21/22; H01L 21/38
(52) U.S. Cl. ....................................... 438/552; 438/639
(58) Field of Search ................................. 438/514, 533, 438/551, 552, 555, 553, 677, 689, 691

(56) References Cited

U.S. PATENT DOCUMENTS

| 3,646,527 | A | * | 2/1972 | Wada et al. ............. 340/173 R |
| 5,445,710 | A | * | 8/1995 | Hori et al. ................ 156/643.1 |
| 5,888,593 | A | * | 3/1999 | Petrmichl et al. ............ 427/563 |
| 5,981,398 | A | * | 11/1999 | Tsai et al. .................... 438/710 |
| 5,998,100 | A | * | 12/1999 | Azuma et al. .............. 430/313 |
| 6,211,035 | B1 | * | 4/2001 | Moise et al. ................ 438/396 |

FOREIGN PATENT DOCUMENTS

JP              07-297170        * 11/1995

* cited by examiner

Primary Examiner—David Nelms
Assistant Examiner—Phuc T. Dang
(74) Attorney, Agent, or Firm—Jacqueline J. Garner; W. James Brady, III; Frederick J. Telecky, Jr.

(57) ABSTRACT

A carbon hardmask (122) for etching hard-to-etch materials (110/112/114) such as Pt, Ir, Ru, $IrO_2$, $RuO_2$, BST, PZT, SBT, FeNi, and FeNiCo and other used in DRAMs, FeRAMs, and magnetic storage devices. Chemically assisted physical sputter etching using argon and limited or no oxygen may be used to etch the hard-to-etch materials (110/112/114) with high selectivity to the carbon hardmask (122).

19 Claims, 3 Drawing Sheets

USING A CARBON FILM AS AN ETCH HARDMASK FOR HARD-TO-ETCH MATERIALS

This application claims priority under 35 USC § 119(e)(1) of provisional application No. 60/224,155 filed Aug. 10, 2000.

FIELD OF THE INVENTION

The invention is generally related to the field of semiconductor processing and more specifically to hardmasks for etching hard-to-etch materials in a semiconductor process.

BACKGROUND OF THE INVENTION

Many materials, such as Pt, Ir, Ru, $IrO_2$, $RuO_2$, BST (Barium-strontium-titanate), PZT (Lead Zirconate Titanate), SBT (Bismuth Strontium Tantalunate), FeNi, FeNiCo, and others used in making DRAMs, FeRAMs (ferroelectric random access memories), or magnetic storage devices, are very difficult to etch due to the lack of volatile etch by products under normal plasma etch conditions. The etch of these materials is typically accomplished by physical sputtering or chemically assisted sputtering. As a result, photoresist, silicon oxide, or silicon nitride masks do not offer enough etch selectivity. Therefore, masking for these etches is very difficult.

One masking approach uses a TiAlN based hardmask. Under the proper etch conditions, TiAlN and TiN have enough selectivity to serve as a hardmask when etching these hard-to-etch materials. The proper etch conditions include a gas mixture of oxygen and Cl- or F-bearing gases at specific concentrations. The restrictions on the etch conditions imposed by the hardmask limit the process window and process optimizations. Furthermore, removing the TiAlN hardmask has a tendency to etch the capacitor dielectric and bottom barrier materials.

SUMMARY OF THE INVENTION

The invention uses a carbon hardmask for etching hard-to-etch materials such as Pt, Ir, Ru, $IrO_2$, $RuO_2$, BST (Barium-strontium-titanate), PZT (Lead Zirconate Titanate), SBT (Bismuth Strontium Tantalunate), FeNi, and FeNiCo.

An advantage of the invention is providing a hardmask for etching hard-to-etch materials that expands the process chemistries available for etching the hard-to-etch materials.

This and other advantages will be apparent to those of ordinary skill in the art having reference to the specification in conjunction with the drawings.

DETAILED DESCRIPTION OF THE EMBODIMENTS

The invention will now be described in conjunction with etching capacitors. It will be apparent to those of ordinary skill in the art having reference to the specification that the benefits of the invention may be applied to patterned etching of other structures containing hard-to-etch materials (e.g., Pt, Ir, Ru, $IrO_2$, $RuO_2$, BST, PZT, SBT, FeNi, FeNiCo).

Figure 1:
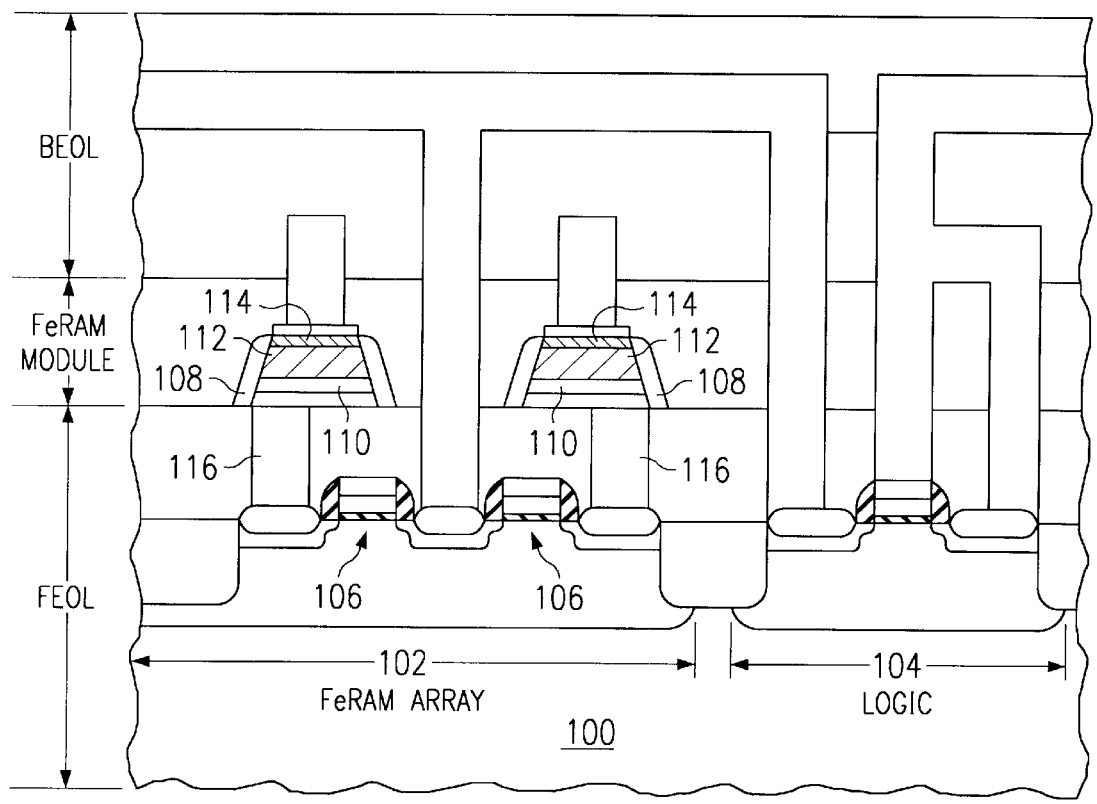
FIG. 1 is a cross-sectional diagram of an embedded FeRAM array fabricated according to an embodiment of the invention.

FIG. 1 is a cross-section of an embedded FeRAM array 102. FeRAM array 102 is combined with logic circuitry 104 on a substrate 100. A pair of FeRAM cells is shown in FIG. 1. Each pair of cells comprises a pair of transistors 106 and a pair of capacitors 108. Each capacitor 108 comprises a bottom electrode 110, a capacitor dielectric 112, and a top electrode 114. A barrier layer, 120, such as TiAlN is usually used between the dielectrics and bottom electrode 110. Capacitor 108 contains hard-to-etch materials, such as those listed above. As an example, the top and bottom electrodes 110, 114 may comprise Ir and the dielectric 112 may comprise PZT.

Figure 2A:
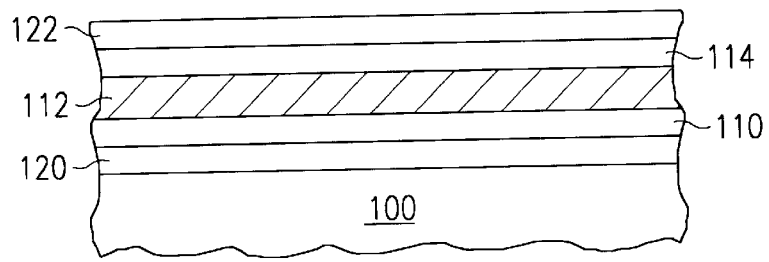
FIGS. 2A–2D are cross-sectional diagrams of the embedded FeRAM of FIG. 1 at various stages of fabrication.

The carbon hardmask according to a first embodiment of the invention may be applied to forming capacitor 108. Standard front end of line (FEOL) processing may be used to form the transistors 106 and contacts 116. Then, the capacitor stack is deposited over the structure as shown in FIG. 2A. FEOL structures and the substrate are indicated generally by semiconductor body 100 in FIGS. 2A–2D. The capacitor stack typically includes a barrier layer 120, bottom electrode 110, capacitor dielectric 112 and top electrode 114. The barrier layer 120 may, for example comprise, TiAlN. However, other suitable barrier materials are known in the art.

Still referring to FIG. 2a, a carbon film 122 is formed over the top electrode 114. Carbon film 122 may be deposited by physical vapor deposition (PVD) or chemical vapor deposition (CVD). The thickness of carbon film 122 may be on the order of 2500 Angstroms. The minimum thickness of this hardmask is determined by the layer thicknesses in the capacitor stack and by the plasma dry etch chemistries in order to achieve the desired results, such as sidewall profile angle, damage to the ferroelectric materials, etc.

Figure 2B:
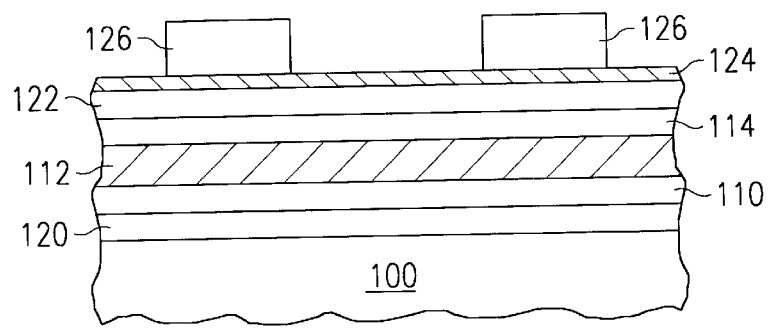
Figure 2C:
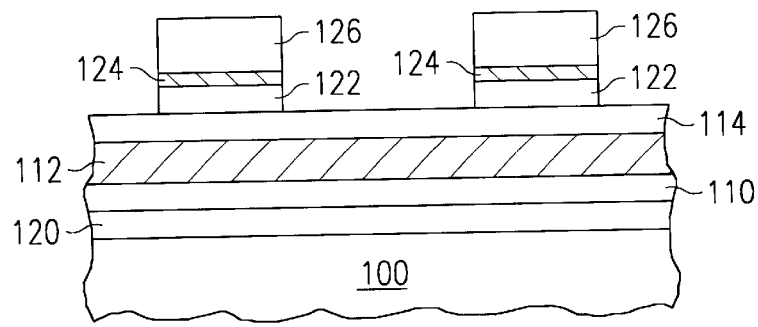

An antireflective coating (ARC) 124, if desired, and resist pattern 126 are formed over the carbon hardmask 122, as shown in FIG. 2B. ARC 124 may be an inorganic of organic antireflective coating, such as Si—O—N. With resist pattern 126 in place, ARC 124 and carbon hardmask 122 are etched as shown in FIG. 2C. ARC 124 and hardmask 122 may be etched using a plasma containing halogen-based gases (e.g., Cl- of F-based gases). Optionally oxygen may be added to the etch to optimize the C:resist selectivity and sidewall profile of the mask.

After etching the carbon hardmask 122, the resist 126 may optionally be stripped. A wet strip is preferred for selectivity between the resist 126 and carbon 122. The ARC layer 124, if it is of the dielectric kind such as SiON, can remain after the resist strip. But if ARC 124 is organic in nature, it may be partially or completely removed during resist strip. In all cases, whether the ARC layer is present or not at the start of the stack etch should have little impact to the subsequent processing. It will be consumed completely during the stack etch. Because the resist 126 must only withstand the etch of the ARC 124 and carbon hardmask 122, it can be thinner than the prior art. A thinner resist layer eases the depth of field requirements at lithography. The reduced aspect ratio, defined as the ratio between the depth of the feature to the width of the feature, helps to eliminate etch byproduct redeposition and etch residue formation.

Figure 2D:
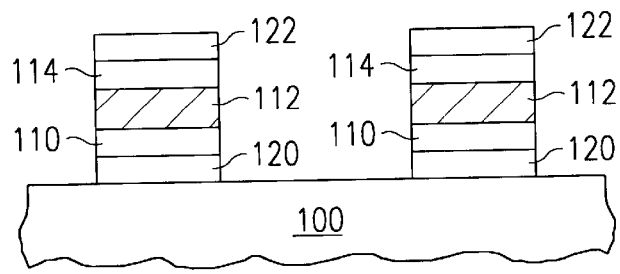

Next, the capacitor stack 110/112/114 is dry etched using a physical sputtering etch or chemically assisted physical sputtering etch, as shown in FIG. 2D. In the preferred embodiment, a chemically assisted physical sputtering etch is used. An etch chemistry of Ar and small amount of other gases such as $Cl_2$, $BCl_3$, $N_2$, $CF_4$, $CHF_3$, or $SF_6$ may be used to etch Pt, Ir, Ru, $IrO_2$, $RuO_2$, BST, PZT, FeNi, and/or FeNiCo. The barrier layer 120 is etched next. In the case of TiAlN barrier, a Cl-based plasma, such as $Cl_2$, $BCl_3$, etc., with or without other gases (Ar, $N_2$, etc.) can be applied. The etching is chemical and the bias power of the plasma can be much lower than that in the capacitor stack etch. The low bias process insures that the possible etching of the top electrode is minimized in case the barrier etch also removes all the remaining hardmask and exposing the top electrode.

Carbon has the lowest sputter yield among a host of materials. Table 1 below contains the sputter etch rate for various materials in by 500 eV Ar+ in Å/min. The data is estimated from a chart in "Handbook of Ion Beam Processing Technology" page 342 by J. J. Cuomo, S. M. Rossnagel and H. R. Kaufman 1989.

TABLE 1

| Material | Sputter Etch Rate by 500 eV Ar + (Å/min) |
| --- | --- |
| C | 55 |
| Al | ~500 |
| NiFe | ~500 |
| Ir | 540 |
| Ru | 580 |
| Pt | 780 |

Next, the carbon hardmask 122 is removed. For example, an ash using an oxygen-based plasma may be used. This process will also remove any remaining resist, even though it is most unlikely to have any resist remaining at the end of the capacitor etch.

Processing then continues to form protective sidewalls 130 and back end of line (BEOL) processing to result in the structure of FIG. 1.

Figure 3:
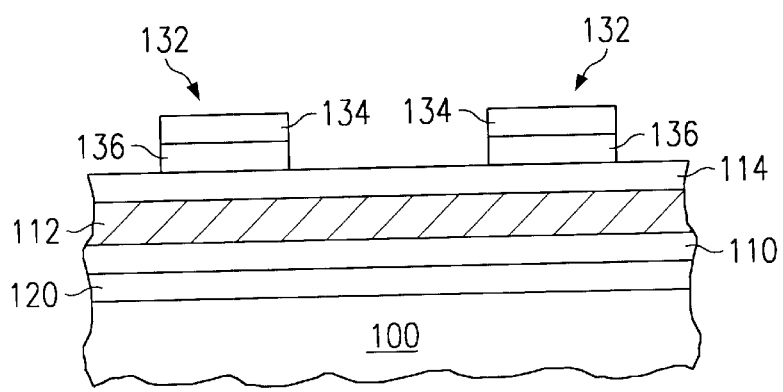
FIG. 3 is a cross-sectional diagram of a bi-layer hardmask according to an embodiment of the invention.

In an alternative embodiment, the carbon hardmask 112 of the above example is replaced with a bi-layer hardmask 132 as shown in FIG. 3. Bi-layer hardmask 132 includes a carbon film 134 and an additional layer 136. Layer 136 may include, for example, $SiO_2$, SiN, TiN, or TiAlN. The carbon hardmask 134 can be used for etching the top electrode 114 and part or all of the ferroelectric layer 112. The second hardmask 136 can be used to etch the bottom portion of the capacitor stack, for example, the ferroelectric layer 112 and the bottom electrode 110. Hardmask layer 136 is chosen so that it is more etch-resistant in a plasma containing a higher percentage of halogen-based gases suitable for PZT and/or Ir etch. Furthermore, in the case that hardmask 136 is $SiO_2$ or SiN, this hardmask will be used during the bottom electrode barrier 120 etch in a Cl-rich plasma, and possible top electrode erosion during this etch can be eliminated.

Figure 4:
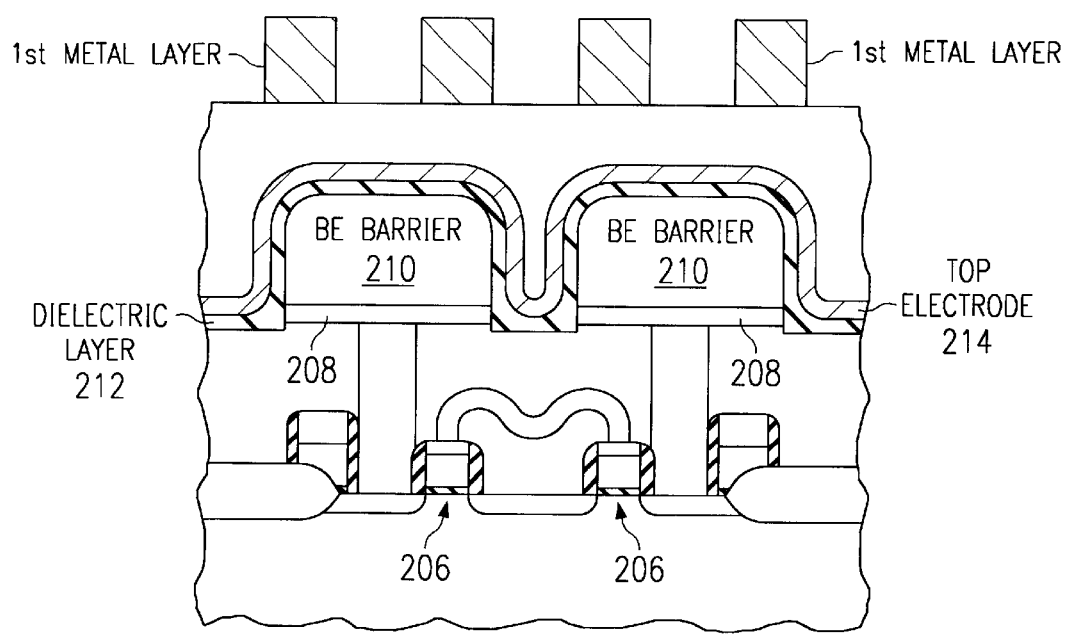
FIG. 4 is a cross-sectional diagram of a DRAM array fabricated according to an embodiment of the invention.

FIG. 4 shows a cross-section of a DRAM array. A pair of DRAM cells is shown. Each pair of cells comprises a pair of transistors 206 and a pair of capacitors 208. Each capacitor 208 comprises a bottom electrode (or storage node) 210, a capacitor dielectric 212, and a top electrode 214. Capacitor 208 contains hard-to-etch materials. As an example, the top and bottom electrodes 210, 214 may comprise Pt and the dielectric 212 may comprise BST.

Figure 5A:
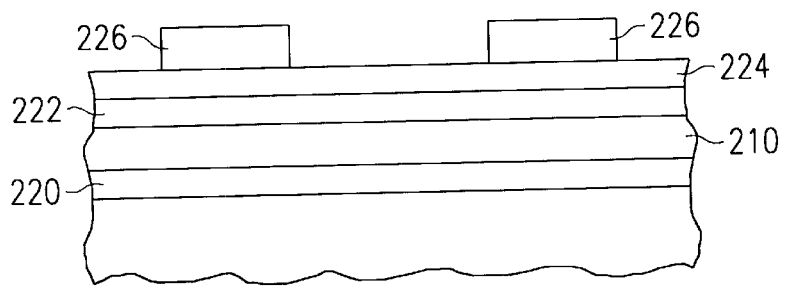
FIGS. 5A–5C are cross-sectional diagrams of the DRAM of FIG. 4 at various stages of fabrication.
Figure 5B:
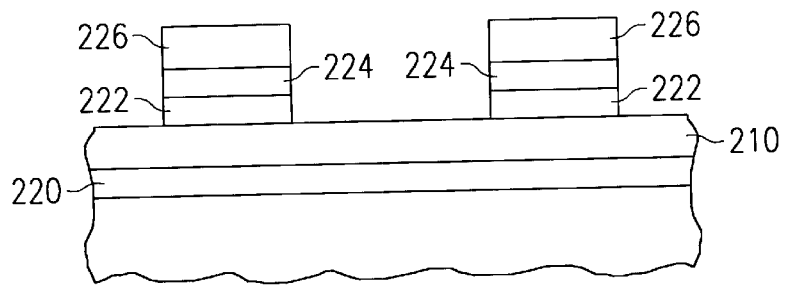

The carbon hardmask of the invention may be applied to forming the bottom electrode 210 is the following manner. After the transistors and storage node contacts are formed, a barrier 220 is deposited over the structure as shown in FIG. 5A. The bottom electrode 210 material is then deposited. A carbon film 222 is deposited over the bottom electrode 210 material. An ARC layer 224 and resist pattern 226 are formed over the carbon film. ARC 224 may be an inorganic of organic antireflective coating, such as Si—O—N. With resist pattern 226 in place, ARC 224 and carbon hardmask 222 are etched as shown in FIG. 5B. ARC 224 and hardmask 222 may be etched using a plasma containing halogen-based gases (e.g., Cl- of F-based gases) as described above with reference to the first embodiment. Oxygen may be added to the etch to optimize the C:resist selectivity.

Figure 5C:
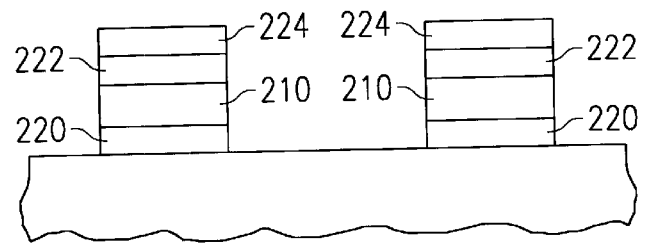

Next, the resist pattern 226 may be optionally removed by wet etch. Then, the bottom electrode 210 is etched using a physical sputtering etch or chemically assisted physical sputtering etch, as shown in FIG. 5C. In the preferred embodiment, a chemically assisted physical sputtering etch is used. An etch chemistry of Ar and small amount of other gases such as $Cl_2$, $BCl_3$, $N_2$, $CF_4$, $CHF_3$, or $SF_6$ may be used to etch Pt, Ir, Ru, $IrO_2$, $RuO_2$, BST, PZT, SBT, FeNi, and/or FeNiCo. The barrier layer 120 is etched next. In the case of TiAlN barrier, a Cl-based plasma, such as $Cl_2$, $BCl_3$, etc., with or without other gases (Ar, $N_2$, etc.) can be applied. The etching is chemical and the bias power of the plasma can be much lower than that in the bottom electrode etch. The low bias process insures that the possible etching of the bottom electrode is minimized in case the barrier etch also removes all the remaining hardmask. Then, the carbon hardmask 222 is removed. For example, an ash using an oxygen-based plasma may be used.

After removing the carbon hardmask 222, the capacitor dielectric 212 and top electrode 214 are deposited. The top electrode 214 is typically a common electrode. However, the carbon hardmask of the invention may also be used for a patterned etch of the top electrode 214 and capacitor dielectric 212 to remove them from the peripheral area (not shown) or, in the case of embedded DRAMs, from the logic areas.

If desired, the carbon hardmask 222 of the above embodiment may be replaced with a bi-layer hardmask, such as bi-layer hardmask 132 described above. The second layer of the hardmask can be $SiO_2$ or SiN, which provides the etch resistance during the TiAlN barrier etch to protect the Pt bottom electrode.

Other applications for the carbon hardmasks of the invention will be apparent to those of ordinary skill in the art having reference to the specification. For example, the carbon hardmask may be used for etching Ni—Fe like alloys used in magnetic storage devices.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method of fabricating an integrated circuit, comprising the steps of:

forming a layer over a semiconductor body, wherein said layer comprises a hard-to-etch material selected from the group consisting of Pt, Ir, Ru, $IrO_2$, $RuO_2$, EST, PZT, SBT, FeNi, and FeNiCo;

forming a carbon hardmask over said layer; and etching said layer using physical sputter etching with a gas chemistry comprising argon.

2. The method of claim 1, wherein said step of forming the carbon hardmask comprises physical vapor deposition of carbon.

3. The method of claim 1, wherein said step of forming the carbon hardmask comprises chemical vapor deposition of carbon.

4. The method of claim 1, wherein said step of forming the carbon hardmask comprises the steps of:
   depositing a carbon film over said layer;
   forming a resist pattern over said carbon film; and
   etching said carbon film using a plasma with a halogen-based gas to form said carbon hardmask.

5. The method of claim 4, further comprising the step of depositing an antireflective coating over said carbon film prior to forming said resist pattern.

6. The method of claim 4, further comprising the step of removing said resist pattern prior to etching said layer.

7. The method of claim 1, wherein said gas chemistry further comprises at least one gas selected from the group consisting of $Cl_2$, $BCl_3$, $N_2$, $CF_4$, $CHF_3$, and $SF_6$.

8. The method of claim 1, wherein said gas chemistry does not comprise oxygen.

9. The method of claim 1, wherein said physical sputter etching is chemically assisted physical sputter etching.

10. The method of claim 1, wherein said carbon hardmask comprises at least two films, wherein one layer comprises said carbon film.

11. The method of claim 10, wherein another of said at least two films comprises a material selected from the group consisting of silicon dioxide, silicon nitride, titanium-nitride, and titanium-aluminum-nitride.

12. The method of claim 1, wherein said integrated circuit comprises a DRAM array.

13. The method of claim 1, wherein said integrated circuit comprises a FeRAM array.

14. The method of claim 1, wherein said integrated circuit comprises a magnetic storage device.

15. A method for fabricating an integrated circuit, comprising the steps of:
   depositing a first electrode material over a semiconductor body, said first electrode material selected from the group consisting of Pt, Ir, Ru, $IrO_2$, $RuO_2$, BST, PZT, SBT, FeNi, and FeNiCo;
   depositing a carbon film over the first electrode material;
   forming a resist pattern over the carbon film;
   etching said carbon film using said resist pattern with a plasma comprising a halogen-based gas to form a carbon hardmask;
   removing said resist pattern;
   etching said first electrode material using said carbon hardmask with a physical sputter having an etch chemistry comprising argon; and
   ashing in an oxygen plasma to remove said carbon hardmask.

16. The method of claim 15, further comprising the steps of:
   forming a capacitor dielectric over the first electrode material; and
   forming a second electrode material over the capacitor dielectric prior to depositing said carbon film, wherein said step of etching said first electrode material also etches said capacitor dielectric and said second electrode material to form a capacitor.

17. The method of claim 15, wherein the step of forming a resist pattern comprises forming an antireflective coating over the carbon film.

18. The method of claim 15, wherein said carbon hardmask comprises a film in addition to said carbon film.

19. The method of claim 18, wherein said additional film comprises a material selected from the group consisting of silicon dioxide, silicon nitride, titanium-nitride, and titanium-aluminum-nitride.

* * * * *